United States Patent
Dong et al.

(10) Patent No.: US 11,257,454 B2
(45) Date of Patent: Feb. 22, 2022

(54) SHIFT REGISTER AND DRIVING METHOD THEREOF, AND DISPLAY APPARATUS

(71) Applicants: Beijing BOE Display Technology Co., Ltd., Beijing (CN); BOE TECHNOLOGY GROUP CO., LTD., Beijing (CN)

(72) Inventors: Ji Dong, Beijing (CN); Bingqing Yang, Beijing (CN); Wenjun Xiao, Beijing (CN); Haoliang Ji, Beijing (CN); Zhiying Bao, Beijing (CN); Xiaoxiao Chen, Beijing (CN); Bo Feng, Beijing (CN); Shijun Wang, Beijing (CN); Wenkai Mu, Beijing (CN); Chao Gao, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 248 days.

(21) Appl. No.: 16/624,820

(22) PCT Filed: Apr. 22, 2019

(86) PCT No.: PCT/CN2019/083696
§ 371 (c)(1),
(2) Date: Dec. 19, 2019

(87) PCT Pub. No.: WO2020/087885
PCT Pub. Date: May 7, 2020

(65) Prior Publication Data
US 2021/0327386 A1    Oct. 21, 2021

(30) Foreign Application Priority Data
Oct. 30, 2018    (CN) .......................... 201811276528.6

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2310/0286* (2013.01); *G09G 2310/08* (2013.01); *G09G 2330/00* (2013.01)

(58) Field of Classification Search
None
See application file for complete search history.

(56) References Cited

U.S. PATENT DOCUMENTS

2011/0255653 A1    10/2011    Chae
2018/0108290 A1    4/2018    Chen
(Continued)

FOREIGN PATENT DOCUMENTS

CN    105513524 A    4/2016
CN    106157874    11/2016
(Continued)

OTHER PUBLICATIONS

International Search Report Issued in Application No. PCT/CN2019/083696, dated Jul. 26, 2019, (10p).

(Continued)

*Primary Examiner* — Aneeta Yodichkas
(74) *Attorney, Agent, or Firm* — Arch & Lake LLP

(57) ABSTRACT

A shift register, a method for driving the shift register and a display apparatus are provided. The shift register includes a noise reduction control circuit and a pull-up node noise reduction circuit. The noise reduction control circuit is connected with a first clock signal terminal that receives a first clock signal, a gate drive signal output terminal that outputs a gate drive signal, a noise reduction control terminal, and a noise reduction control node. The pull-up node noise reduction circuit is connected with the noise reduction (Continued)

control circuit, the noise reduction control terminal, and a pull-up node.

20 Claims, 9 Drawing Sheets

(56) References Cited

U.S. PATENT DOCUMENTS

2018/0144677 A1   5/2018  Zhang et al.
2018/0226132 A1   8/2018  Gao et al.

FOREIGN PATENT DOCUMENTS

| | | |
|---|---|---|
| CN | 106409207 | 2/2017 |
| CN | 106409213 | 2/2017 |
| CN | 107068106 A | 8/2017 |
| CN | 108281123 | 7/2018 |
| CN | 108538335 | 9/2018 |
| CN | 108665846 A | 10/2018 |
| CN | 109192238 A | 1/2019 |
| JP | 6033225 B | 11/2016 |
| KR | 20180069270 | 6/2018 |
| WO | 2018161565 | 9/2018 |

OTHER PUBLICATIONS

First Chinese Office Action (including English Translation) issued in CN201811276528.6, dated Apr. 23, 2020, 11 pages.
Jeongrim Seo, "Low Power and Low Noise Shift Register for In-Cell Touch Display Applications", (Journal of the Electron Devices Society) ,[A] 1-18,* 726-732 *.
何常德, — 种 WXGA 液晶显示 测试技术学报 器的非晶硅 《栅极驱动电路", 》,[A] 1-18,*249-253 *.

SHIFT REGISTER AND DRIVING METHOD THEREOF, AND DISPLAY APPARATUS

CROSS-REFERENCE TO RELATED APPLICATIONS

This application is the U.S. national phase of PCT Application No. PCT/CN2019/083696 filed on Apr. 22, 2019, which claims priority of the Chinese Patent Application No. 201811276528.6, filed on Oct. 30, 2018, the entire contents of both of which are incorporated herein by reference in their entirety for all purposes.

TECHNICAL FIELD

The present disclosure generally relates to the field of display technology, and more particularly, to a shift register, driving method thereof, and a display apparatus including a gate drive circuit.

BACKGROUND ART

At present, a gate drive circuit includes multiple stages of shift registers, and further includes a first dummy shift register and a second dummy shift register. However, neither the gate drive signal output terminal of the first dummy shift register nor the gate drive signal output terminal of the second dummy shift register is connected with a gate line of a liquid crystal display panel. There is a need for improved method for driving a shift register.

SUMMARY

One example of the present disclosure provides a shift register including a noise reduction control circuit connected with a first clock signal terminal and a gate drive signal output terminal, wherein the first clock signal terminal receives a first clock signal, and wherein the gate drive signal output terminal outputs a gate drive signal; and a pull-up node noise reduction circuit connected with the noise reduction control circuit; wherein the noise reduction control circuit is connected with a noise reduction control terminal, and a noise reduction control node; and wherein the pull-up node noise reduction circuit is connected with the noise reduction control terminal and a pull-up node.

Another example of the present disclosure provides a method for driving a shift register including the following steps: S01: during a gate drive signal output stage, controlling, by the shift register including a noise reduction control circuit, a potential of a noise reduction control node at a first level under the control of a first clock signal, wherein the shift register further includes a pull-up node noise reduction circuit connected with the noise reduction control circuit, a noise reduction control terminal, and a pull-up node, and wherein the noise reduction control circuit is connected with a first clock signal terminal that receives the first clock signal and a gate drive signal output terminal that outputs a gate drive signal;

S02: during a noise reduction period that is included in an output cutoff stage, maintaining, by the noise reduction control circuit, the potential of the noise reduction control node at the first level; and controlling, by the noise reduction control circuit, the potential of the noise reduction control terminal at an active level under the control of the potential of the noise reduction control node; and S03: during the noise reduction period, reducing, by the pull-up node noise reduction circuit, noise for the pull-up node under the control of the potential of the noise reduction control terminal.

Another example of the present disclosure provides a display apparatus including a gate drive circuit including: a shift register including a noise reduction control circuit connected with a first clock signal terminal and a gate drive signal output terminal, wherein the first clock signal terminal receives a first clock signal, and wherein the gate drive signal output terminal outputs a gate drive signal; and a pull-up node noise reduction circuit connected with the noise reduction control circuit; wherein the noise reduction control circuit is connected with a noise reduction control terminal, and a noise reduction control node; and wherein the pull-up node noise reduction circuit is connected with the noise reduction control terminal and a pull-up node.

It is to be understood that the above general description and the detailed description below are only exemplary and explanatory and not intended to limit the present disclosure.

BRIEF DESCRIPTION OF THE DRAWINGS

The accompanying drawings, which are incorporated in and constitute a part of this specification, illustrate examples consistent with the present disclosure and, together with the description, serve to explain the principles of the present disclosure.

DETAILED DESCRIPTION

Figure 1:
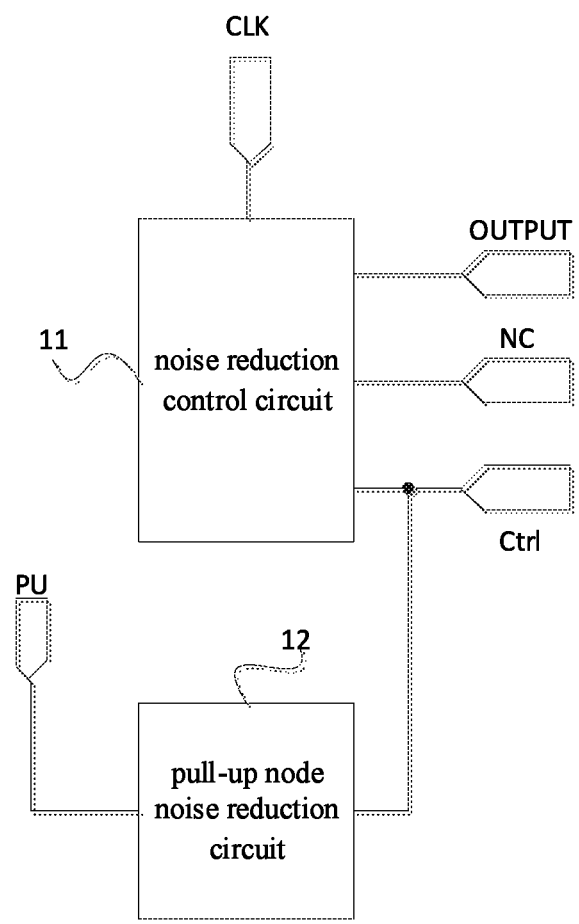
FIG. 1 is a schematic diagram showing an exemplary shift register.

Generally, when the gate drive circuit scans forward, the first dummy shift register provides an input signal for a shift register at the first stage. When the gate drive circuit scans backward, the first dummy shift register provides a reset signal for the shift register at the first stage. Additionally, when the gate drive circuit scans forward, the second dummy shift register provides a reset signal for a shift register at the last stage. When the gate drive circuit scans backward, the second dummy shift register provides an input signal for the shift register at the last stage. The gate drive signal output terminal of the shift register at the last stage is connected with the last gate line of the display panel.

At present, when the gate drive circuit scans forward, the potential of the pull-up node of the second dummy shift register cannot be lowered by any reset signal outside because the reset terminal of the second dummy shift register is not connected with a reset signal. As a result, an output transistor that is connected with the gate of the second dummy shift register and the pull-up node maintains open for a long time, therefore causing the body bias of the output transistor. Accordingly, when the gate drive circuit scans backward, the second dummy shift register cannot correctly provide input signals for the shift registers at the last stage.

Reference will now be made in detail to examples of which are illustrated in the accompanying drawings. The following description refers to the accompanying drawings in which the same numbers in different drawings represent the same or similar elements unless otherwise represented. The implementations set forth in the following description of examples do not represent all implementations consistent with the disclosure. Instead, they are merely examples of apparatuses and methods consistent with aspects related to the disclosure as recited in the claims.

The terminology used in the present disclosure is for the purpose of describing exemplary examples only and is not intended to limit the present disclosure. As used in the present disclosure and the claims, the singular forms "a" "an" and "the" are intended to include the plural forms as well, unless the context clearly indicates otherwise. It shall also be understood that the terms "or" and "and/or" as used herein are intended to signify and include any or all possible combination of one or more associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one example," "an example," "another example," or the like in the singular or plural means that one or more particular features, structures, or characteristics described in connection with an example is included in at least one example of the present disclosure. Thus, the appearances of the phrases "in one example" or "in an example," "in another example," or the like in the singular or plural in various places throughout this specification are not necessarily all referring to the same example. Furthermore, the particular features, structures, or characteristics in one or more examples may include combined in any suitable manner.

The transistors used in the examples of the present disclosure may be bipolar transistors, thin film transistors, filed effect transistors, or other similar devices. In the examples of the present disclosure, in order to differentiate the two electrodes other than the control electrode, one of the two electrodes is referred as a first electrode, and the other one is referred as a second electrode.

When the transistor is a bipolar transistor, the control electrode is the base, the first electrode is the emitter and the second electrode is the collector, or otherwise the first electrode is the collector and the second electrode is the emitter.

When the transistor is a thin film transistor or a filed effect transistor, the control electrode is the gate, the first electrode is the drain and the second electrode is the source, or otherwise the first electrode is the source and the second electrode is the drain.

FIG. 1 is a schematic diagram showing an exemplary shift register. The shift register includes a first clock signal terminal that receives a first clock signal CLK, a gate drive signal output terminal OUTPUT that outputs a gate drive signal. The shift register may further include a noise reduction control circuit 11 and a pull-up node noise reduction circuit 12. The noise reduction control circuit 11 is connected with the gate drive signal output terminal OUTPUT, a noise reduction control terminal Ctrl, and a noise reduction control node NC. The pull-up node noise reduction circuit 12 is connected with the noise reduction control terminal Ctrl and a pull-up node PU.

During a gate drive signal output stage S12 and under the control of the first clock signal CLK, the noise reduction control circuit 11 controls the potential of the noise reduction control node NC at a first level based on the gate drive signal. During a noise reduction period S131 that is included in an output cutoff stage S13, the noise reduction control circuit 11 maintains the potential of the noise reduction control node NC at the first level and controls the potential of the noise reduction control terminal Ctrl at an active level under the control of the potential of the noise reduction control node NC.

During the noise reduction period S131, the pull-up node noise reduction circuit 12 reduces noise for the pull-up node PU under the control of the potential of the noise reduction control terminal Ctrl. Therefore, the shift register provided in this example may reduce noise for the pull-up node PU during the noise reduction period S131 that is included in the output cutoff stage S13. The shift register may lower the potential of the pull-up node PU at the same stage, and therefore the gate drive signal output terminal OUTPUT of the shift register at the next stage is not required to lower the potential of the pull-up node PU at the previous stage.

Preferably, when the transistor whose gate is controlled at the first level is a N-type transistor, the first level may be, but not limited to, a high level that enables the transistor ON. And when the transistor whose gate is controlled at the first level is a P-type transistor, the first level may be, but not limited to, a low level that enables the transistor OFF.

Preferably, the first level is illustrated, but not limited to, as a high level.

Preferably, the active level is a level that enables the transistor ON. For example, when the transistor is a N-type transistor, the active level may be a high level. And when the transistor is a P-type transistor, the active level may be a low level.

When the shift register in this example operates, a display period may include an input stage, a gate drive signal output stage, and an output cutoff stage that are sequentially arranged. The output cutoff stage includes a noise reduction period during which the noise reduction control circuit 11 controls the potential of the noise reduction control terminal Ctrl at an active level under the control of the potential of the noise reduction control node NC, and the pull-up node noise reduction circuit 12 reduces noise for the pull-up node PU under the control of the potential of the noise reduction control terminal Ctrl.

Preferably, during the noise reduction period, the pull-up node noise reduction circuit 12 reduces noise for the pull-up node PU by controlling the connection between the pull-up node NC and a low voltage terminal or Ground under the control of the noise reduction control terminal Ctrl.

Preferably, during a noise reduction reset period that is included in the output cutoff stage, the noise reduction control circuit 11 resets the potential of the noise reduction control terminal Ctrl at an inactive level.

Preferably, the pull-up node noise reduction circuit 12 is connected with a noise reduction voltage terminal and disconnects the pull-up node and the noise reduction voltage terminal when the potential of the noise reduction control terminal Ctrl is at the inactive level.

As a result, it is avoided that when the next display period starts, the potential of the pull-up node cannot be elevated correctly during the input stage and the gate drive signal output period.

Figure 2:
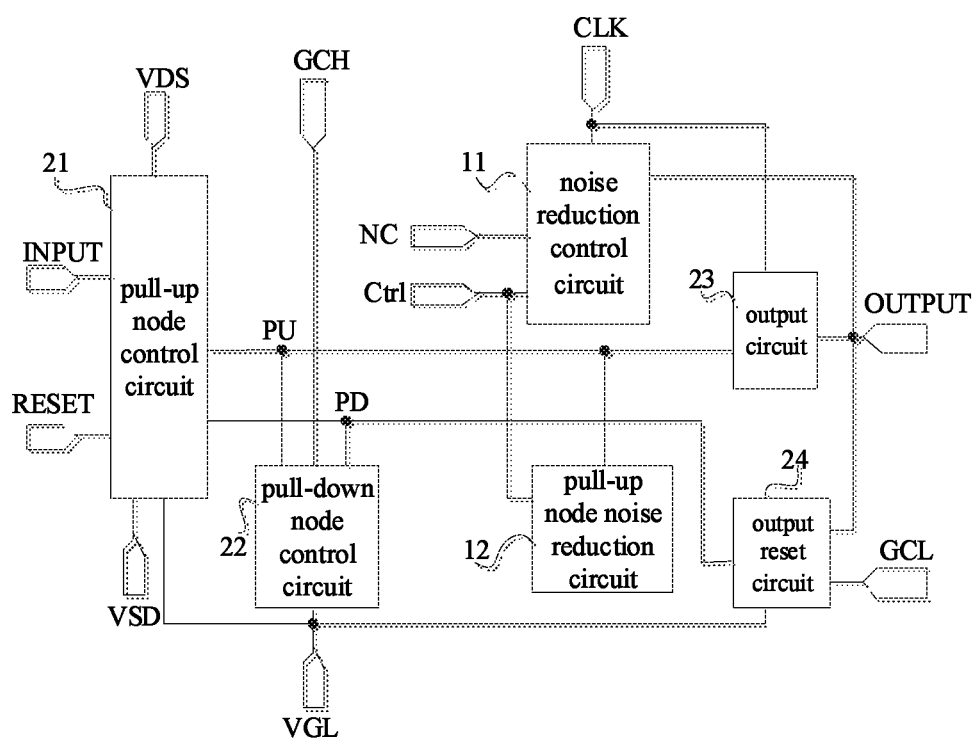
FIG. 2 is a schematic diagram of an exemplary shift register.

FIG. 2 is a schematic diagram of an exemplary shift register. The shift register further includes a pull-up node control circuit 21, a pull-down node control circuit 22, an output circuit 23 and an output reset circuit 24. Additionally, the pull-up node control circuit 21 is connected with an input terminal INPUT, a reset terminal RESET, a pull-down node PD, a first scan voltage terminal VDS, a second scan voltage terminal VSD, a second voltage terminal VGL, and the pull-up node PU. The pull-up node control circuit 21 controls the connection between the pull-up node PU and the first scan voltage terminal VDS under the control of the input terminal INPUT, controls the connection between the pull-up node PU and the second scan voltage terminal VSD under the control of the reset terminal RESET, and controls the connection between the pull-up node PU and the second voltage terminal VGL under the control of the pull-down node PD.

The pull-down node control circuit 22 is connected with a first voltage terminal GCH, the pull-up node PU, the pull-down node PD and the second voltage terminal VGL. The pull-down node control circuit 22 controls the potential of the pull-down node PD under the control of the potential of the pull-up node PU.

The output circuit 23 is connected with the pull-up node PU, the first clock signal terminal and the gate drive signal output terminal OUTPUT. The output circuit 23 controls the connection between the gate drive signal output terminal OUTPUT and the first clock signal terminal under the control of the potential of the pull-up node PU. And the first clock signal terminal receives a first clock signal CLK.

The output reset circuit 24 is connected with the gate drive signal output terminal OUTPUT, the pull-down node PD, the second voltage terminal VGL and a third voltage terminal GCL; and the output reset circuit 24 controls the connection between the gate drive signal output terminal OUTPUT and the second voltage terminal VGL under the control of the potential of the pull-down node PD and/or a third voltage signal inputted by the third voltage terminal GCL.

Furthermore, the second voltage terminal VGL is a low voltage terminal that receives a low voltage. During a display period, GCH receives a high voltage, and GCL receives a low voltage. During a blanking period, GCH receives a low voltage, and GCL receives a high voltage. As a result, the output reset circuit 24 controls the gate drive signal output terminal OUTPUT at the low voltage, and the shift register has no output during the blanking period.

When the shift register operates, the pull-up node control circuit 21 controls the potential of the pull-up node PU, the pull-down node control circuit 22 controls the potential of the pull-down node PD, the output circuit 23 controls the output of the gate drive signal from the gate drive signal output terminal OUTPUT, and the output reset circuit 24 resets the gate drive signal output terminal OUTPUT.

Figure 3:
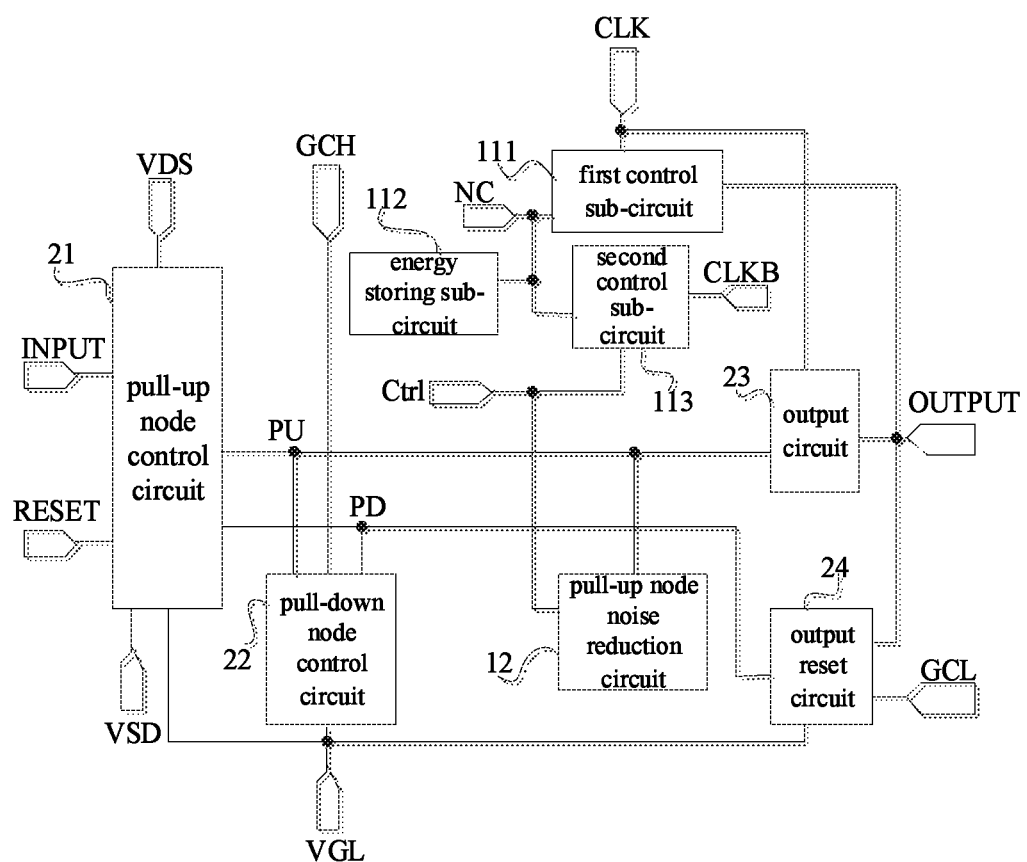
FIG. 3 is a schematic diagram of an exemplary shift register.

FIG. 3 is a schematic diagram of an exemplary shift register. According to the shift register illustrated in FIG. 2, the shift register further includes a second clock signal terminal that receives a second clock signal CLKB. The noise reduction control circuit 11 may include a first control sub-circuit 111, an energy storing sub-circuit 112, and a second control sub-circuit 113.

The first control sub-circuit 111 is connected with the first clock signal terminal, the noise reduction control node NC, and the gate drive signal output terminal OUTPUT. The energy storing sub-circuit 112 is connected with the noise reduction control node NC. The second control sub-circuit 113 is connected with the noise reduction control node NC, the second clock signal terminal CLKB, and the noise reduction control terminal Ctrl.

During the gate drive signal output stage S12, the first control sub-circuit 111 controls the connection between the noise reduction control node NC and the gate drive signal output terminal OUTPUT under the control of the first clock signal CLK, and charges the energy storing sub-circuit 112 by the gate drive signal that is outputted from the gate drive signal output terminal OUTPUT, so as to set the potential of the noise reduction control node NC at the first level.

During the noise reduction period S131, the energy storing sub-circuit 112 maintains the potential of the noise reduction control node NC at the first level.

During the noise reduction period S131, the second control sub-circuit 113 controls the connection between the noise reduction control terminal Ctrl and the second clock signal terminal under the control of the potential of the noise reduction control node NC, so as to set the potential of the noise reduction control terminal Ctrl at the active level.

When the shift register operates, during the gate drive signal output stage S12, the first control sub-circuit 111 enables the connection between the noise reduction control node NC and the gate drive signal output terminal OUTPUT under the control of the first clock signal CLK. During the gate drive signal output stage S12, the gate drive signal output terminal OUTPUT outputs the gate drive signal whose potential is at the first level, and thereby enabling the connection between the noise reduction control node NC and the energy storing sub-circuit 112. Accordingly, the first control sub-circuit 111 charges the energy storing sub-circuit 112 by the gate drive signal that is outputted from the gate drive signal output terminal OUTPUT, so as to set the potential of the noise reduction node NC at the first level.

During the noise reduction period S131 that is included in the output cutoff stage S13, the energy storing sub-circuit 112 maintains the potential of the noise reduction control node NC at the first level, and the second control sub-circuit 113 controls the connection between the noise reduction control terminal Ctrl and the second clock signal terminal under the control of the potential of the noise reduction control node NC, so as to set the potential of the noise reduction control terminal Ctrl at the active level. The pull-up node noise reduction circuit 12 reduces the noise of the pull-up node PU under the control of the noise reduction control terminal Ctrl.

Preferably, the energy storing sub-circuit 112 may further connect with the noise reduction control terminal Ctrl. Specifically, the first terminal of the energy storing sub-circuit 112 is connected with the noise reduction control node NC and the second terminal of the energy storing sub-circuit 112 is connected with the noise reduction control terminal Ctrl.

During the noise reduction reset period S132 that is included in the output cutoff stage S13, the first control sub-circuit 111 is configured to control the connection between the gate drive signal output terminal OUTPUT and the noise reduction control terminal Ctrl under the control of the first clock signal CLK, so as to discharge the energy storing sub-circuit 112. As a result, the potential of the noise reduction control node NC and the potential of the noise reduction control terminal Ctrl are reset, and the potential of the noise reduction control terminal Ctrl is set to be at an inactive level. During the output cutoff stage S13, the gate drive signal output terminal OUTPUT outputs a low level.

Figure 4:
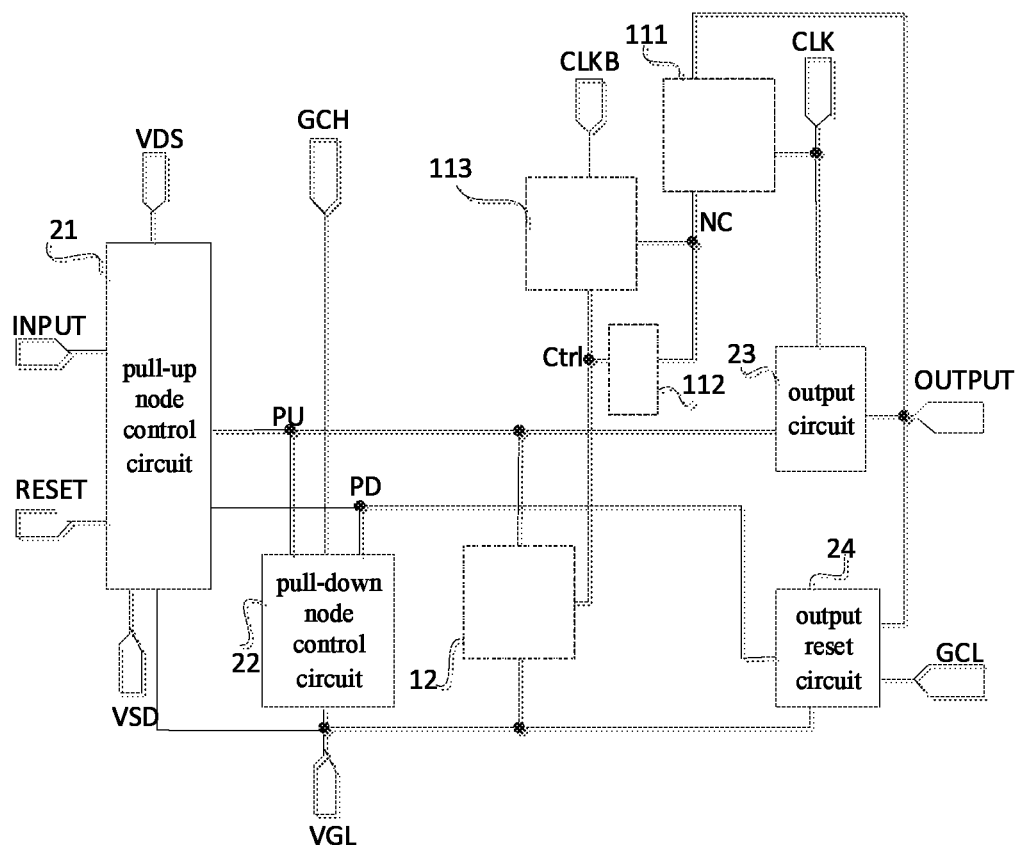
FIG. 4 is a schematic diagram of an exemplary shift register.

FIG. 4 is a schematic diagram of an exemplary shift register. According to the shift register in FIG. 3, the first control sub-circuit 111 may further include a first control transistor M11. The gate of the first control transistor M11 is connected with the first clock signal terminal, the drain of the first control transistor M11 is connected with the gate drive signal output terminal OUTPUT, and the source of the first control transistor M11 is connected with the noise reduction control node NC. The first clock signal terminal receives the first clock signal CLK.

The energy storing sub-circuit 112 may further include a noise reduction control capacitor C2. A first end of the capacitor is connected with the noise reduction control node NC, and a second end of the capacitor is connected with the noise reduction control terminal Ctrl.

The second control sub-circuit 113 may further include a second control transistor M12. The gate of the second control transistor M12 is connected with the noise reduction control node NC, the drain of the second control transistor M12 is connected with the second clock signal terminal that receives a second clock signal CLKB, and the source of the second control transistor M12 is connected with the noise reduction control terminal Ctrl.

The pull-up node noise reduction circuit 12 may further include a pull-up node noise reduction transistor M13. The gate of the pull-up node noise reduction transistor M13 is connected with the noise reduction control terminal Ctrl, the drain of the pull-up node noise reduction transistor M13 is connected with the pull-up node PU, and the source of the pull-up node noise reduction transistor M13 is connected with a low voltage terminal that receives a low voltage VGL.

Preferably, the noise reduction voltage terminal is the low voltage terminal; M11, M12 and M13 may be, but not limited to, N-type Metal-Oxide-Semiconductor (NMOS).

Preferably, the output cutoff stage S13 includes the noise reduction period S131 and the noise reduction reset period S132 that is after the noise reduction period S131.

During the gate drive signal output stage S12, the gate drive signal outputted by the gate drive signal output terminal OUTPUT is at a high level, the first clock signal CLK is at a high level, and the second clock signal CLKB is at a low level. So that M11 is ON and the gate drive signal that is outputted from the gate drive signal output terminal OUTPUT charges for C2. Accordingly, the potential of the gate of M12 is set at a high level.

During the noise reduction period S131 that is included in the output cutoff stage S13, the gate drive signal outputted from the gate drive signal output terminal OUTPUT is at a low level, CLK is at a low level, CLKB is at a high level, and the potential of the gate of M12 is maintained at a high level so that M12 is ON. Accordingly, the potential of the gate of M13 is set at a high level, so that M13 is ON. Therefore, the noise of the pull-up node PU is reduced by the low voltage VGL.

During the noise reduction reset period S132 that is included in the output cutoff stage S13, the gate drive signal outputted from the gate drive signal output terminal OUTPUT is at a low level, CLK is at a high level, CLKB is at a low level, and M11 is ON. Accordingly, the first end of C2 is connected with OUTPUT, so that C2 is discharged and the potentials of the NC and Ctrl are lowered. When the potential of the NC is not lowered to a pre-set level, M12 is ON and the second end of C2 is controlled by CLKB, so that C2 can be discharged until the potential of the NC is lowered below the pre-set level and then M12 is OFF. Accordingly, the potential of the Ctrl is lowered so that M13 is OFF.

Preferably, the pre-set level can be determined by a threshold voltage of M12.

Figure 5:
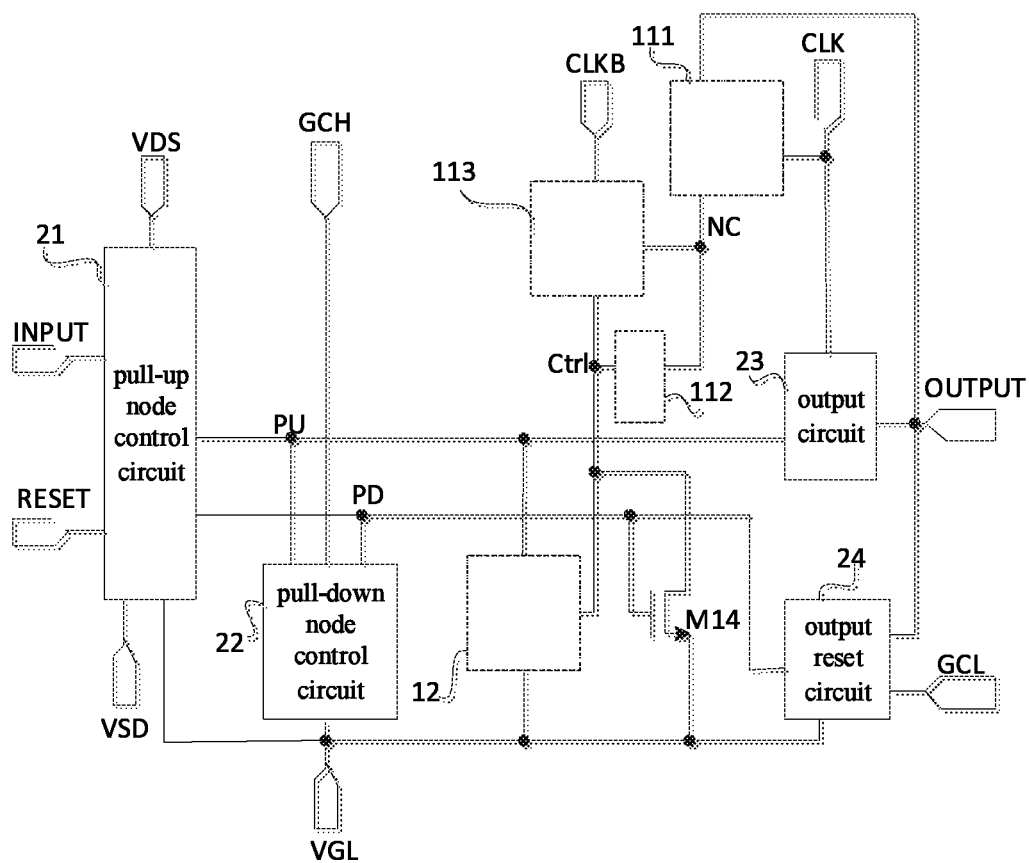
FIG. 5 is a schematic diagram of an exemplary shift register.

FIG. 5 is a schematic diagram of an exemplary shift register. In this example, the noise reduction control circuit 11 may further includes a noise transistor M14. The gate of M14 is connected with the pull-down node PD, the drain of M14 is connected with the noise reduction control terminal Ctrl, the source of M14 is connected with the low voltage terminal that receives the low voltage VGL.

Preferably, the noise reduction voltage terminal is the low voltage terminal, and M14 is, but not limited to, N-type Metal-Oxide-Semiconductor (NMOS).

When the shift register operates, M14 is ON when the potential of the pull-down node PD is at a high level, so that the potential of the noise reduction control terminal Ctrl is reset under the control of the low voltage VGL.

Figure 6:
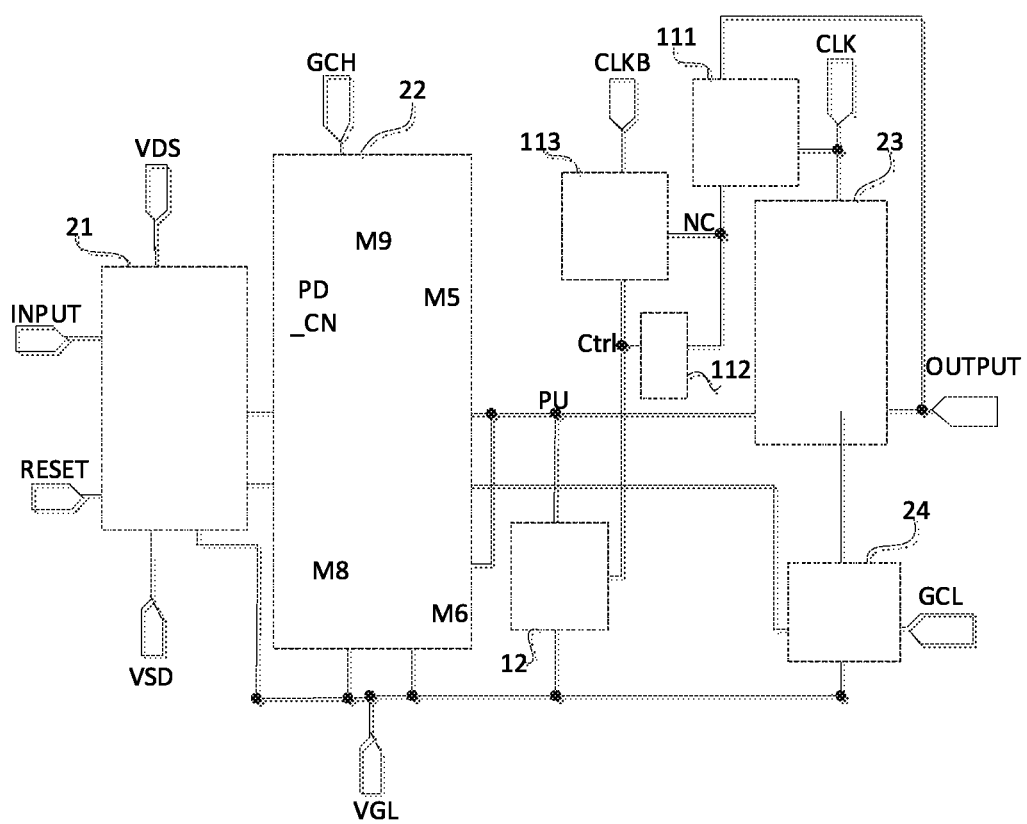
FIG. 6 is a circuit diagram of an exemplary shift register.

FIG. 6 is a circuit diagram of an exemplary shift register. The shift register includes a first clock signal terminal that receives a first clock signal CLK, a second clock signal terminal that receives a second clock signal CLKB, and a gate drive signal output terminal OUTPUT that outputs a gate drive signal.

The shift register further includes a noise reduction control circuit, a pull-up node noise reduction circuit 12, a pull-up node control circuit 21, a pull-down node control circuit 22, an output circuit 23 and an output reset circuit 24. And the noise reduction control circuit further includes a first control sub-circuit 111, an energy storing sub-circuit 112 and a second control sub-circuit 113.

The first control sub-circuit 111 includes a first control transistor M11. The gate of M11 is connected with the first clock signal terminal, the drain of M11 is connected with the gate drive signal output terminal OUTPUT, and the source of M11 is connected with a noise reduction control node NC.

The energy storing sub-circuit 112 includes a noise reduction control capacitor C2. A first end of C2 is connected with the noise reduction control node NC, and a second end of C2 is connected with a noise reduction control terminal Ctrl.

The second control sub-circuit 113 includes a second control transistor M12. The gate of M12 is connected with the noise reduction control node NC, the drain of M12 is connected with the second clock signal terminal, and the source of M12 is connected with the noise reduction control terminal Ctrl.

The pull-up node noise reduction circuit 12 includes a pull-up node noise reduction transistor M13. The gate of M13 is connected with the noise reduction control terminal Ctrl, the drain of M13 is connected with the pull-up node PU, and the source of M13 is connected with a low voltage terminal that receives a low voltage VGL.

The pull-up node control circuit 21 includes a first pull-up control transistor M1, a second pull-up control transistor M2, and a third pull-up control transistor M10. The gate of M1 is connected with an input terminal INPUT, the drain of M1 is connected with a first scan voltage terminal VDS, and the source of M1 is connected with the pull-up node PU.

Additionally, the gate of M2 is connected with a reset terminal RESET, the drain of M2 is connected with the pull-up node PU, and the source of M2 is connected with a second scan voltage terminal VSD.

The gate of M10 is connected with the pull-down node PD, the drain of M10 is connected with the pull-up node PU, and the source of M10 is connected with the low voltage terminal that receives the low voltage VGL.

The pull-down node control circuit 22 includes a first pull-down control transistor M9, a second pull-down control transistor M8, a third pull-down control transistor M5, and a fourth pull-down control transistor M6.

The gate and the drain of M9 are connected with a first voltage terminal GCH, and the source of M9 is connected with a pull-down control node PD_CN.

The gate of M8 is connected with the pull-up node PU, the drain of M8 is connected with the pull-down control node PD_CN, and the source of M8 is connected with the low voltage terminal that receives the low voltage VGL.

The gate of M5 is connected with the pull-down control node PD_CN, the drain of M5 is connected with the first voltage terminal GCH, and the source of M5 is connected with the pull-down node PD.

The gate of M6 is connected with the pull-up node PU, the drain of M6 is connected with the pull-down node PD, and the source of M6 is connected with the low voltage terminal.

The output circuit 23 includes an output transistor M3 and a storage capacitor C1. The gate of M3 is connected with the pull-up node PU, the drain of M3 is connected with the first clock signal terminal that receives the first clock signal CLK, and the source of M3 is connected with the gate drive signal output terminal OUTPUT.

Additionally, a first end of the storage capacitor C1 is connected with the pull-up node PU, and a second end of the storage capacitor C1 is connected with the gate drive signal output terminal OUTPUT.

The output reset circuit 24 includes a first output reset transistor M4 and a second output reset transistor M7. The gate of M4 is connected with the pull-down node PD, the drain of M4 is connected with the gate drive signal output terminal OUTPUT, and the source of M4 is connected with the low voltage terminal.

The gate of M7 is connected with a third voltage terminal GCL, the drain of M7 is connected with the gate drive signal output terminal OUTPUT, and the source of M7 is connected with the low voltage terminal.

Preferably, the noise reduction voltage terminal is the low voltage terminal, the second voltage terminal is the low voltage terminal, and the transistors are, but not limited to, N-type Metal-Oxide-Semiconductor (NMOS).

Preferably, the input terminal INPUT is connected with the gate drive signal output terminal of a shift register at the previous stage, and the reset terminal RESET is connected with the gate drive signal output terminal OUTPUT of a shift register at the next stage.

When a gate drive circuit including the shift register scans forward, VDS receives a first scan voltage at a high level and receives a second scan voltage at a low level. When the gate drive circuit scans backward, VDS receives the first scan voltage at a low level and receives the second scan voltage at a high level.

Preferably, VGL is a reference potential of low potential in a Gate on Array (GOA) circuit. GCH receives a first voltage signal that controls the pull-down node PD. During the display period, GCH receives a high level and during the blanking period, GCH receives a low level.

Preferably, GCL receives a third voltage signal. During the display period, GCL receives a low level. During the blanking time, GCL receives a high level, so that M7 is ON and OUPUT outputs a low level.

Preferably, during the display period, CLK and CLKB are phase reversed clock signals. During the blanking period, CLK and CLKB may be at a low level. Accordingly, CLK, CLKB and the gate drive signal outputted from the gate drive signal output terminal OUTPUT reduce the noise for the pull-up node PU.

Preferably, the width to length ratio of M8 is larger than that of M9. And the width to length ratio of M6 is smaller than that of M5.

Figure 7:
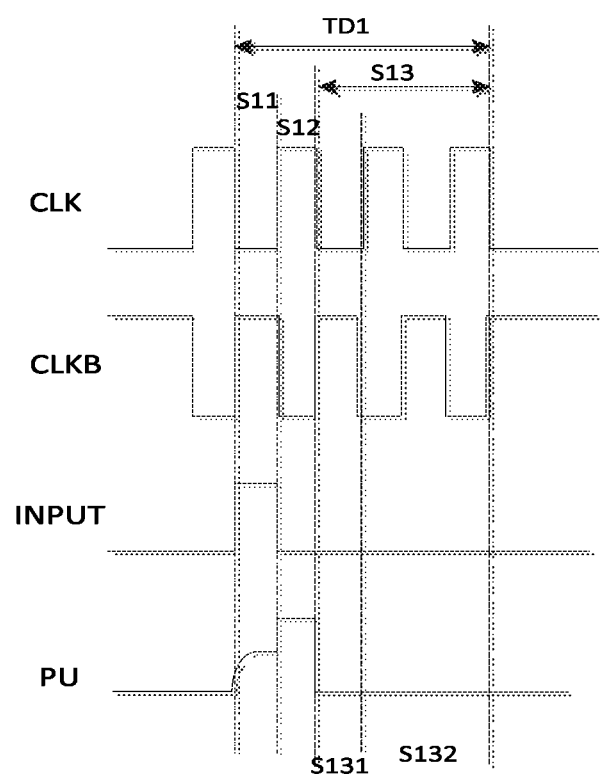
FIG. 7 is a timing diagram of an exemplary shift register.

FIG. 7 is a timing diagram of an exemplary shift register. When the shift register illustrated in FIG. 6 operates, the display period TD1 includes an input stage S11, a gate drive signal output stage S12, and an output cutoff stage S13 that are sequentially arranged.

When a gate drive circuit including the shift register scans forward, during the input stage S11, INPUT receives a high level, RESET receives a low level, VDS receives a high level, VSD receives a low level, CLK is at a low level, CLKB is at a high level, M1 is ON, and M2 is OFF, so that the potential of PU is set at a high level; GCH receives a high level, GCL receives a low level, M9 and M8 are ON, the potential of PD_CN is at a low level, M6 is ON, and M5 is OFF, so that the potential of PD is at a low level.

During the gate drive signal output stage S12, INPUT and RESET receive a low level, GCH receives a high level, GCL receives a low level, CLK is at a high level, CLKB is at a low level, C1 elevates the potential of PU, the potential of PD is maintained at a low level, M3 is ON, and OUTPUT receives CLK, so that the gate drive signal outputted from OUTPUT is at a high level. Accordingly, M11 is ON, NC connected with OUTPUT charges C2 by the gate drive signal, so that the potential of NC is set to be at a high level. M12 is ON, Ctrl receives CLKB, the potential of Ctrl is at a low level and M13 is OFF.

The output cutoff stage S13 includes a reset period S131 and an output cutoff period S132. The reset period S131 is the noise reduction period, and the output cutoff period S132 includes noise reduction reset period.

During the reset period S131, INPUT receives a low level, GCH receives a high level, GCL receives a low level, CLK is at a low level, CLKB is at a high level, M11 is OFF, C2 maintains the potential of NC at a high level, M12 is ON, Ctrl receives CLKB so that the potential of Ctrl is at a high level, M13 is ON, PU receives VGL so as to reduce noise for PU, M9 is ON, M6 and M8 are OFF, the potential of PD_CN is at a high level, M5 is ON so that the potential of PD is at a high level, M3 is OFF, and M4 is ON so that OUTPUT receives VGL and outputs a low voltage.

During the reset period S131, even if the shift register is a dummy shift register at the last stage included in GOA and RESET receives no reset signal so as to lower the potential of PU during the reset period S131, the shift register may reduce the noise for PU by controlling M11, M12 and M13 under the control of OUTPUT, CLK and CLKB.

During the output cutoff period S132, GCH receives a high level, GCL receives a low level, the interval of adjacent CLKs is a high level and a low level, the interval of adjacent CLKBs is a low level and a high level, and OUTPUT outputs a low voltage.

During the noise reduction reset period that is included in the output cutoff period S132, CLK is at a high level, CLKB is at a low level, and M11 is ON. OUTPUT is connected with NC, outputs a signal at a low level, and discharges C2. As a result, the potential of NC and the potential of Ctrl are lowered, the potential of NC and the potential of Ctrl are set to be inactive, and M12 and M13 are OFF.

During the noise reduction reset period, when the potential of NC is not lowered below a pre-set potential, M12 is ON. The second end of C2 receives CLKB and C2 is discharged until the potential of NC is lowered below the pre-set potential. Accordingly, M12 is OFF.

When the gate drive circuit including the shift register scans forward, VDS receives a low level and VSD receives a high level.

Figure 8:
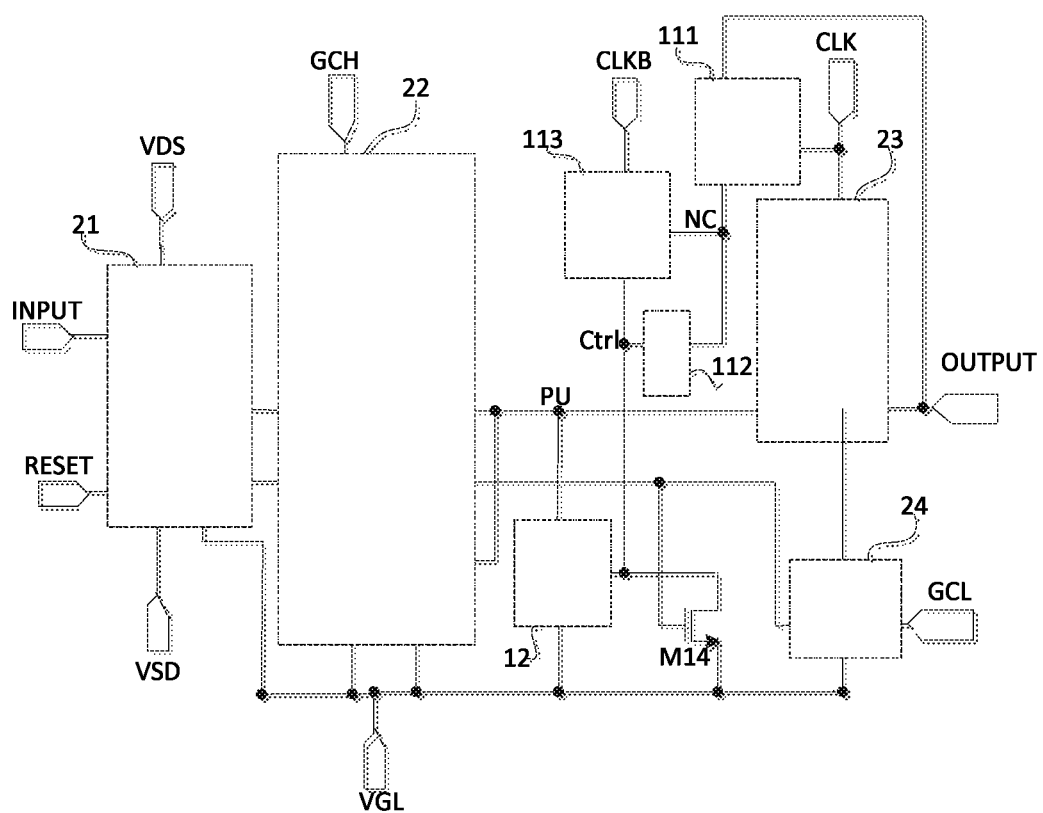
FIG. 8 is a circuit diagram of an exemplary shift register.

FIG. 8 is a circuit diagram of an exemplary shift register. The noise reduction control circuit may further include a noise reduction transistor M14. The gate of M14 is connected with the pull-down PD. The drain of M14 is connected with the noise reduction control terminal Ctrl. The source of M14 is connected with the low voltage terminal that receives a low voltage VGL.

Preferably, M14 may be NMOS, and the noise reduction voltage terminal is, but not limited to, a low voltage terminal.

Preferably, the reset period may include a noise reduction period. During the noise reduction period, the noise of PU is reduced so that the potential of PU is set to be at a low voltage.

When the potential of PU is at a low voltage, the potential of PD is elevated to be a high voltage by M9 and M5. M14 is ON so as to reset the potential of Ctrl. Accordingly, M13 is OFF. And the period during which the potential of PD is at a high voltage is the noise reduction reset period.

Additionally, the present disclosure further provides a method for driving a shift register including the following steps of:

S01: during a gate drive signal output stage S12, controlling, by the shift register including a noise reduction control circuit 11, a potential of a noise reduction control node NC at a first level under the control of a first clock signal CLK; wherein the shift register further includes a pull-up node noise reduction circuit 12 connected with the noise reduction control circuit 11, a noise reduction control terminal Ctrl, and a pull-up node PU, and wherein the noise reduction control circuit 11 is connected with a first clock signal terminal that receives a first clock signal and a gate drive signal output terminal that outputs a gate drive signal;

S02: during a noise reduction period S131 that is included in an output cutoff stage S13, maintaining, by the noise reduction control circuit 11, the potential of the noise reduction control node NC at the first level; controlling, by the noise reduction control circuit 11, the potential of the noise reduction control terminal Ctrl at an active level under the control of the potential of the noise reduction control node NC; and reducing, by the pull-up node noise reduction circuit 12, noise for the pull-up node PU under the control of the potential of the noise reduction control terminal Ctrl;

S03: during the noise reduction period S131, the pull-up node noise reduction circuit 12 reduces noise for the pull-up node PU under the control of the potential of the noise reduction control terminal Ctrl.

Therefore, the shift register may reduce noise for the pull-up node PU during the noise reduction period S131 that is included in the output cutoff stage S13. The shift register may lower the potential of a pull-up node PU at the same stage, and therefore the gate drive signal output terminal of a shift register at the next stage is not required to lower the potential of a pull-up node PU at the previous stage.

Specifically, the output cutoff stage includes a noise reduction reset period that is after the noise reduction period. And the pull-up node noise reduction circuit is connected with a noise reduction voltage terminal.

The method further includes the following step:

S04: during the noise reduction reset period S132, resetting, by the noise reduction control circuit 11, the potential of the noise reduction control terminal Ctrl at an inactive level, and disconnecting, by the pull-up node noise reduction circuit 12, the pull-up node PU and the noise reduction voltage terminal.

As a result, it is avoided that when the next display period starts, the potential of the pull-up node cannot be elevated correctly during the input stage and the gate drive signal output period.

The shift register further includes a second clock signal terminal. The noise reduction control circuit includes a first control sub-circuit 111, an energy storing sub-circuit 112, and a second control sub-circuit 113. The energy storing sub-circuit 112 is connected with the noise reduction control node NC.

The step of S01 further includes: during the gate drive signal output stage, controlling, by the first control sub-circuit 111, the connection between a noise reduction control node NC and the gate drive signal output terminal OUTPUT under the control of the first clock signal CLK, and charging, by the first control sub-circuit 111, the energy storing sub-circuit 112 by the gate drive signal that is outputted by the gate drive signal output terminal OUTPUT, so as to set the potential of the noise reduction control node NC at the first level.

The step of S02 further includes: during the noise reduction period S131, maintaining, by the energy storing sub-circuit 112, the potential of the noise reduction control node NC at the first level; during the noise reduction period S131, controlling, by the second control sub-circuit 113, the connection between the noise reduction control terminal Ctrl and the second clock signal terminal CLKB under the control of the potential of the noise reduction control node NC, so as to set the potential of the noise reduction control terminal Ctrl at the active level.

Furthermore, the energy storing sub-circuit 112 is connected with the noise reduction control terminal Ctrl; and wherein the output cutoff stage S13 includes a noise reduction reset period S132 that is after the noise reduction period S131.

The method further includes the step of S05: during the noise reduction reset period S132, controlling, by the first control sub-circuit 111, the connection between the gate drive signal output terminal OUTPUT and the noise reduction control node NC under the control of the first clock signal CLK, so as to discharge the energy storing sub-circuit 112, reset the potential of the noise reduction control node NC and potential of the noise reduction control terminal Ctrl, and set the potential of the noise reduction control terminal Ctrl at the inactive level.

Preferably, the gate drive circuit may include multiple stages of the shift registers illustrated above. The gate drive circuit may further include a first dummy shift register and a second dummy shift register.

Preferably, the structure of the first dummy shift register and the second dummy shift register are the same as that of the shift registers illustrated above.

Therefore, this example can reduce noise for a pull-up node in the shift register at the same stage by the gate drive signal output terminal at the same stage, the first clock signal, and the second clock signal.

Figure 9:
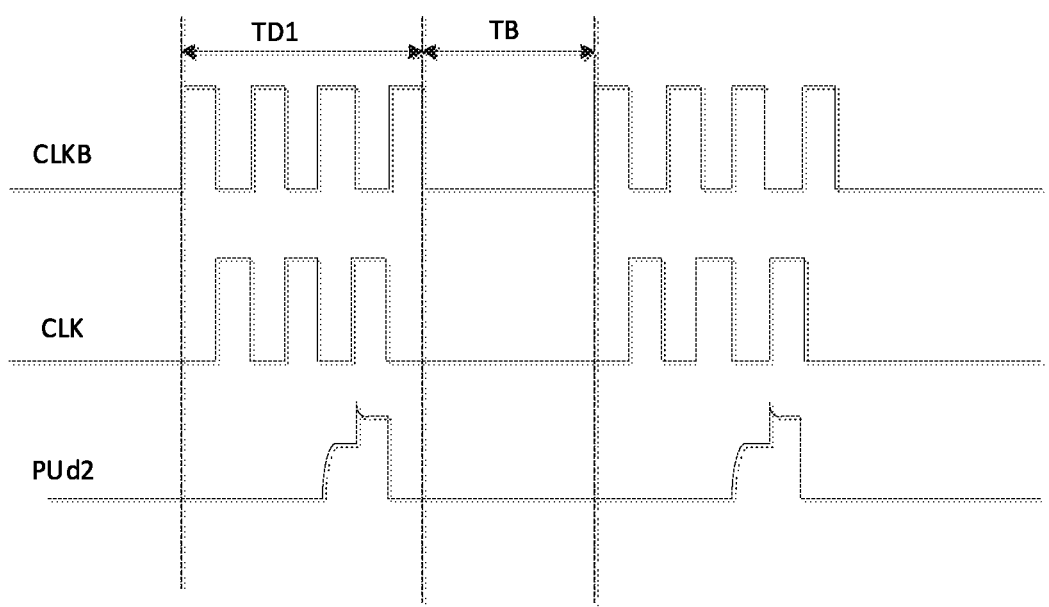
FIG. 9 illustrates an oscillogram of the potential of a pull-up node in a dummy shift register at the last stage included in a gate drive circuit.

FIG. 9 is an oscillogram of the potential of a pull-up node in a dummy shift register at the last stage included in a gate drive circuit. As illustrated in FIG. 9, during the display period, CLK and CLKB are phase reversed clock signals and they start the blanking period after the potential of the pull up node PUd2 of the second dummy swift register is lowered by CLKB.

The present disclosure further provides a display apparatus including the gate drive circuit illustrated above.

Preferably, the display apparatus may be a device including a displayer, for example, a mobile phone, a tablet, a television, a monitor, a laptop, a digital photo frame, or a GPS.

It should be noted that the examples of the present disclosure are well implemented, and do not make limitations of any form to the present disclosure. Any changes or modifications that may be made by the technicians familiar with this field using the above-disclosed technical contents are equally effective examples. Any modifications or equivalent changes and polishes made on the above disclosed examples, which are not independent of the contents of the technical schemes of the present disclosure, and are in accordance with the technical essence of the present disclosure, and are in accordance with the technical essence of the present disclosure, are still covered in the scope of the technical schemes of the present disclosure.

What is claimed is:

1. A shift register, comprising:
    a noise reduction control circuit connected with a first clock signal terminal and a gate drive signal output terminal, wherein the first clock signal terminal receives a first clock signal, and wherein the gate drive signal output terminal outputs a gate drive signal; and
    a pull-up node noise reduction circuit connected with the noise reduction control circuit;
    wherein the noise reduction control circuit is connected with a noise reduction control terminal, and a noise reduction control node; and
    wherein the pull-up node noise reduction circuit is connected with the noise reduction control terminal and a pull-up node.

2. The shift register of claim 1, wherein during a gate drive signal output stage and under the control of the first clock signal, the noise reduction control circuit controls a potential of the noise reduction control node at a first level based on the gate drive signal;
    wherein during a noise reduction period that is included in an output cutoff stage, the noise reduction control circuit maintains the potential of the noise reduction control node at the first level and controls the potential of the noise reduction control terminal at an active level under the control of the potential of the noise reduction control node;
    and wherein during the noise reduction period, the pull-up node noise reduction circuit reduces noise for the pull-up node under the control of the potential of the noise reduction control terminal.

3. The shift register of claim 1, further comprising a second clock signal terminal;
    wherein the noise reduction control circuit comprises a first control sub-circuit, an energy storing sub-circuit, and a second control sub-circuit;
    wherein the first control sub-circuit is connected with the first clock signal terminal, the noise reduction control node, and the gate drive signal output terminal;
    wherein the energy storing sub-circuit is connected with the noise reduction control node and;
    and wherein the second control sub-circuit is connected with the noise reduction control node, the second clock signal terminal, and the noise reduction control terminal.

4. The shift register of claim 3, wherein during the gate drive signal output stage, the first control sub-circuit controls the connection between the noise reduction control node and the gate drive signal output terminal under the control of the first clock signal;
    wherein the energy storing sub-circuit maintains the potential of the noise reduction control node at the first level during the noise reduction period;
    and wherein during the noise reduction period, the second control sub-circuit controls the connection between the noise reduction control terminal and the second clock signal terminal under the control of the potential of the noise reduction control node.

5. The shift register of claim 3, wherein the first control sub-circuit comprises a first control transistor, a control electrode of the first control transistor is connected with the first clock signal terminal, a first electrode of the first control transistor is connected with the gate drive signal output terminal, and a second electrode of the first control transistor is connected with the noise reduction control node.

6. The shift register of claim 3, wherein the energy storing sub-circuit comprises a noise reduction control capacitor, a first end of the capacitor is connected with the noise reduction control node, and a second end of the capacitor is connected with the noise reduction control terminal.

7. The shift register of claim 3, wherein the second control sub-circuit comprises a second control transistor, a control electrode of the second control transistor is connected with the noise reduction control node, a first electrode of the second control transistor is connected with the second clock signal terminal, and a second electrode of the second control transistor is connected with the noise reduction control terminal.

8. The shift register of claim 1, wherein the pull-up node noise reduction circuit comprises a pull-up node noise reduction transistor, a control electrode of the pull-up node noise reduction transistor is connected with the noise reduction control terminal, a first electrode of the pull-up node noise reduction transistor is connected with the pull-up node, and a second electrode of the pull-up node noise reduction transistor is connected with a noise reduction voltage terminal.

9. The shift register of claim 1, wherein the noise reduction control circuit comprises a noise reduction transistor, a control electrode of the noise reduction transistor is connected with a pull-down node, a first electrode of the noise reduction transistor is connected with the noise reduction control terminal, and a second electrode of the noise reduction transistor is connected with the noise reduction voltage terminal.

10. The shift register of claim 1, further comprising a pull-up node control circuit, a pull-down node control circuit, an output circuit and an output reset circuit;
    wherein the pull-up node control circuit is connected with an input terminal, a reset terminal, a pull-down node, a first scan voltage terminal, a second scan voltage terminal, a second voltage terminal, and the pull-up node; the pull-up node control circuit controls the connection between the pull-up node and the first scan voltage terminal under the control of the input terminal; the pull-up node control circuit controls the connection between the pull-up node and the second scan voltage terminal under the control of the reset terminal; and the pull-up node control circuit controls the connection between the pull-up node and the second voltage terminal under the control of the pull-down node;
    wherein the pull-down node control circuit is connected with a first voltage terminal, the pull-up node, the pull-down node, and the second voltage terminal; and the pull-down node control circuit controls the potential of the pull-down node under the control of the potential of the pull-up node;

wherein the output circuit is connected with the pull-up node, the first clock signal terminal and the gate drive signal output terminal; and the output circuit controls the connection between the gate drive signal output terminal and the first clock signal terminal under the control of the potential of the pull-up node;

and wherein the output reset circuit is connected with the gate drive signal output terminal, the pull-down node, the second voltage terminal, and a third voltage terminal; and the output reset circuit controls the connection between the gate drive signal output terminal and the second voltage terminal under the control of the potential of the pull-down node and/or a third voltage signal received by the third voltage terminal.

11. The shift register of claim 10, wherein the pull-up node control circuit comprises a first pull-up control transistor, a second pull-up control transistor, and a third pull-up control transistor;

wherein a control electrode of the first pull-up control transistor is connected with the input terminal, a first electrode of the first pull-up control transistor is connected with the first scan voltage terminal, and a second electrode of the first pull-up control transistor is connected with the pull-up node;

wherein a control electrode of the second pull-up control transistor is connected with the reset terminal, a first electrode of the second pull-up control transistor is connected with the pull-up node, and a second electrode of the second pull-up control transistor is connected with the second scan voltage terminal;

and wherein a control electrode of the third pull-up control transistor is connected with the pull-down node, a first electrode of the third pull-up control transistor is connected with the pull-up node, and a second electrode of the third pull-up control transistor is connected with the second voltage terminal.

12. The shift register of claim 10, wherein the pull-down node control circuit comprises a first pull-down control transistor, a second pull-down control transistor, a third pull-down control transistor, and a fourth pull-down control transistor;

wherein a control electrode and a first electrode of the first pull-down control transistor are connected with the first voltage terminal, and a second electrode of the first pull-down control transistor is connected with a pull-down control node;

wherein a control electrode of the second pull-down control transistor is connected with the pull-up node, a first electrode of the second pull-down control transistor is connected with the pull-down control node, and a second electrode of the second pull-down control transistor is connected with the second voltage terminal;

wherein a control electrode of the third pull-down control transistor is connected with the pull-down control node, a first electrode of the third pull-down control transistor is connected with the first voltage terminal, and a second electrode of the third pull-down control transistor is connected with the pull-down node;

and wherein a control electrode of the fourth pull-down control transistor is connected with the pull-up node, a first electrode of the fourth pull-down control transistor is connected with the pull-down node, and a second electrode of the fourth pull-down control transistor is connected with the second voltage terminal.

13. The shift register of claim 10, wherein the output circuit comprises an output transistor and a storage capacitor;

wherein a control electrode of the output transistor is connected with the pull-up node, a first electrode of the output transistor is connected with the first clock signal terminal, and a second electrode of the output transistor is connected with the gate drive signal output terminal;

and wherein a first end of the storage capacitor is connected with the pull-up node, a second end of the storage capacitor is connected with the gate drive signal output terminal.

14. The shift register of claim 10, wherein the output reset circuit comprises a first output reset transistor and a second output reset transistor;

wherein a control electrode of the first output reset transistor is connected with the pull-down node, a first electrode of the first output reset transistor is connected with the gate drive signal output terminal, and a second electrode of the first output reset transistor is connected with the second voltage terminal;

and wherein a control electrode of the second output reset transistor is connected with a third voltage terminal, a first electrode of the second output reset transistor is connected with the gate drive signal output terminal, and a second electrode of the second output reset transistor is connected with the second voltage terminal.

15. A method for driving a shift register, comprising the following steps of:

S01: during a gate drive signal output stage, controlling, by the shift register comprising a noise reduction control circuit, a potential of a noise reduction control node at a first level under the control of a first clock signal, wherein the shift register further comprises a pull-up node noise reduction circuit connected with the noise reduction control circuit, a noise reduction control terminal, and a pull-up node, and wherein the noise reduction control circuit is connected with a first clock signal terminal that receives the first clock signal and a gate drive signal output terminal that outputs a gate drive signal;

S02: during a noise reduction period that is included in an output cutoff stage, maintaining, by the noise reduction control circuit, the potential of the noise reduction control node at the first level; and controlling, by the noise reduction control circuit, the potential of the noise reduction control terminal at an active level under the control of the potential of the noise reduction control node; and S03: during the noise reduction period, reducing, by the pull-up node noise reduction circuit, noise for the pull-up node under the control of the potential of the noise reduction control terminal.

16. The method of claim 15, wherein the output cutoff stage comprises a noise reduction reset period that is after the noise reduction period; and wherein the pull-up node noise reduction circuit is connected with a noise reduction voltage terminal;

and the method further comprises the following step of:

S04: during the noise reduction reset period, resetting, by the noise reduction control circuit, the potential of the noise reduction control terminal at an inactive level, and disconnecting, by the pull-up node noise reduction circuit, the pull-up node and the noise reduction voltage terminal.

17. The method of claim 15, wherein the shift register further comprises a second clock signal terminal, the noise reduction control circuit comprises a first control sub-circuit, an energy storing sub-circuit and a second control sub-circuit, and the energy storing sub-circuit is connected with the noise reduction control node;

wherein the step of S01 further comprises:
during the gate drive signal output stage, controlling, by the first control sub-circuit, the connection between the noise reduction control node and the gate drive signal output terminal under the control of the first clock signal, and charging, by the first control sub-circuit, the energy storing sub-circuit by the gate drive signal that is outputted by the gate drive signal output terminal, so as to set the potential of the noise reduction control node at the first level;

and wherein the step of S02 further comprises:
during the noise reduction period, maintaining, by the energy storing sub-circuit, the potential of the noise reduction control node at the first level;
during the noise reduction period, controlling, by the second control sub-circuit, the connection between the noise reduction control terminal and the second clock signal terminal under the control of the potential of the noise reduction control node, so as to set the potential of the noise reduction control terminal at the active level.

18. The method of claim 17, wherein the energy storing sub-circuit is connected with the noise reduction control terminal; and wherein the output cutoff stage comprises a noise reduction reset period that is after the noise reduction period;

and the method further comprises the step of:
during the noise reduction reset period, controlling, by the first control sub-circuit, the connection between the gate drive signal output terminal and the noise reduction control node under the control of the first clock signal, so as to discharge the energy storing sub-circuit, reset the potential of the noise reduction control node and potential of the noise reduction control terminal, and set the potential of the noise reduction control terminal at the inactive level.

19. A display apparatus comprising a gate drive circuit comprising:

a shift register comprising:
a noise reduction control circuit connected with a first clock signal terminal and a gate drive signal output terminal, wherein the first clock signal terminal receives a first clock signal, and wherein the gate drive signal output terminal outputs a gate drive signal; and
a pull-up node noise reduction circuit connected with the noise reduction control circuit;
wherein the noise reduction control circuit is connected with a noise reduction control terminal and a noise reduction control node;
and wherein the pull-up node noise reduction circuit is connected with the noise reduction control terminal and a pull-up node.

20. The display apparatus of claim 19, wherein during a gate drive signal output stage and under the control of the first clock signal, the noise reduction control circuit controls a potential of the noise reduction control node at a first level based on the gate drive signal;

wherein during a noise reduction period that is included in an output cutoff stage, the noise reduction control circuit maintains the potential of the noise reduction control node at the first level and controls the potential of the noise reduction control terminal at an active level under the control of the potential of the noise reduction control node;

and wherein during the noise reduction period, the pull-up node noise reduction circuit reduces noise for the pull-up node under the control of the potential of the noise reduction control terminal.

* * * * *